United States Patent
Sakaguchi (10) Patent No.: US 9,741,933 B2
(45) Date of Patent: Aug. 22, 2017

(54) METHOD FOR REPAIRING ORGANIC EL ELEMENT, METHOD FOR MANUFACTURING ORGANIC EL PANEL, AND LIGHT-EMITTING DEVICE

(71) Applicant: NEC LIGHTING, LTD., Tokyo (JP)

(72) Inventor: Yoshikazu Sakaguchi, Tokyo (JP)

(73) Assignee: NEC LIGHTING, LTD., Tokyo (JP)

( * ) Notice: Subject to any disclaimer, the term of this patent is extended or adjusted under 35 U.S.C. 154(b) by 0 days.

(21) Appl. No.: 14/666,642

(22) Filed: Mar. 24, 2015

(65) Prior Publication Data
US 2015/0280174 A1    Oct. 1, 2015

(30) Foreign Application Priority Data
Mar. 28, 2014 (JP) ................. 2014-070206

(51) Int. Cl.
*H01L 21/00* (2006.01)
*H01L 51/00* (2006.01)
*H01L 51/52* (2006.01)

(52) U.S. Cl.
CPC ...... *H01L 51/0031* (2013.01); *H01L 51/5221* (2013.01); *H01L 2251/564* (2013.01); *H01L 2251/568* (2013.01)

(58) Field of Classification Search
CPC ... H01L 21/00; H01L 1/0031; H01L 51/5221; H02L 2251/568; H02L 2251/564
See application file for complete search history.

(56) References Cited

U.S. PATENT DOCUMENTS 6,777,249 B2 *  8/2004  Yamazaki ............ G09G 3/006
                                                      257/40
2002/0042152 A1 *  4/2002  Yamazaki .......... G09G 3/006
                                                      438/4

FOREIGN PATENT DOCUMENTS

JP        2009-193782        8/2009

\* cited by examiner

*Primary Examiner* — Douglas W Owens
*Assistant Examiner* — Raymond R Chai
(74) *Attorney, Agent, or Firm* — Young & Thompson (57) ABSTRACT

The present invention provides a method for repairing an organic EL element and a method for manufacturing an organic EL panel that can reduce a production cycle time. A method for repairing an organic EL element includes an application step of repeatedly applying a pulse voltage having ON-period and OFF-period to an organic EL element. In the application step, the pulse voltage is a forward voltage or a reverse voltage, and the ON-period is equal to or longer than a time constant that is the product of an element capacity of the organic EL element and a wiring resistance including the element.

17 Claims, 8 Drawing Sheets

I-V characteristic of organic EL panel after repair step

FIG. 15

METHOD FOR REPAIRING ORGANIC EL ELEMENT, METHOD FOR MANUFACTURING ORGANIC EL PANEL, AND LIGHT-EMITTING DEVICE

INCORPORATION BY REFERENCE

This application is based upon and claims the benefit of priority from Japanese patent application No. 2014-070206, filed on Mar. 28, 2014, the disclosure of which is incorporated herein in its entirety by reference.

TECHNICAL FIELD

The present invention relates to a method for repairing an organic EL element, a method for manufacturing an organic EL panel, and a light-emitting device.

BACKGROUND ART

When EL (electroluminescence) elements are used for products in the field of lighting or the like, there is a problem of shorts (short circuits) between their anode and cathode. Particularly, since organic EL lighting has a large light-emitting area to which an electric field is applied, there is a high probability of causing shorts, and this results in low yield and low reliability.

As a measure of the shorts, there is a repair method using laser light as disclosed in Patent Document 1. Specifically, for example, as the repair method, there is a method of conducting about 100-hour lighting for aging prior to shipment and repairing the portions where shorts are caused or shorts are not yet caused but bright points are found using laser light or the like. This method employs a technique that continuously turns on organic EL elements by a forward bias and then locally breaks down to open or insulate the portions where shorts are caused. However, in such a repair method, products need to be energized until shorts have not caused for a predetermined long period so as to improve their reliability. Also, equipment and space will be required for all products that are to be aged.

As another repair method using laser light, there is a method of applying a forward voltage that is equal to or lower than the voltage for causing a normal element (in which no shorts are caused) to emit light, causing the portions that are thinner than normal portions to emit weak light, recognizing their images, and repairing them by using laser light.

On the other hand, as a repair method without using laser light, for example, there is a method of applying a reverse bias direct current (DC) to elements and locally repairing the portions that are thinner than normal portions by a reverse current. However, since the applicable voltage is low in this repair method, there is a problem that a number of portions among the portions where shorts can be caused would remain unrepaired. Therefore, the repair method using laser light is commonly employed.

PRIOR ART DOCUMENTS

Patent Documents

Patent Document 1: JP 2009-193782A

SUMMARY OF THE INVENTION

Problem to be Solved by the Invention

However, the repair method using laser light requires a number of steps for specifying the portions in which breakdown is to be performed by laser light. Therefore, there is a problem of lengthening of a production cycle time.

Hence, the present invention is intended to provide a method for repairing an organic EL element and a method for manufacturing an organic EL panel that can reduce a production cycle time by electrically repairing an organic EL element during an inspection step after manufacturing a panel without using laser light.

Means for Solving Problem

In order to achieve the above object, the present invention provides a method for repairing an organic EL element, including: an application step of repeatedly applying a pulse voltage having ON-period and OFF-period to an organic EL element, wherein in the application step, the pulse voltage is a forward voltage or a reverse voltage, and the ON-period is equal to or longer than a time constant that is the product of an element capacity of the organic EL element and a wiring resistance including the element.

In order to achieve the above object, the present invention also provides a method for repairing an organic EL element, including: an application step of repeatedly applying a forward pulse voltage or a reverse pulse voltage within a range of ±1.5V at most from ½ potential of a threshold voltage while sweeping from a low-voltage side to a high-voltage side.

Effects of the Invention

According to the present invention, it is possible to reduce a production cycle time by electrically repairing an organic EL element during an inspection step after manufacturing a panel without using laser light.

EXEMPLARY EMBODIMENT

Hereinafter, a repair method and a manufacturing method of the present invention will be described in detail with reference to the figures. However, the present invention is not limited to the following embodiments. Note here that, in FIGS. 1 to 15, identical parts may be indicated with identical numerals and symbols, and the descriptions as to the identical parts may be omitted. In the figures, for convenience in explanation, the structures of the respective components may be appropriately simplified, and the dimensions and the like of the respective components may be schematically described and they may be different from the actual dimensions and the like.

Embodiment 1

In the present embodiment, an example in which an organic EL lighting device is applied to a repair method of the present invention as a light-emitting device will be described.

(Organic EL Lighting Device)

Figure 1A:
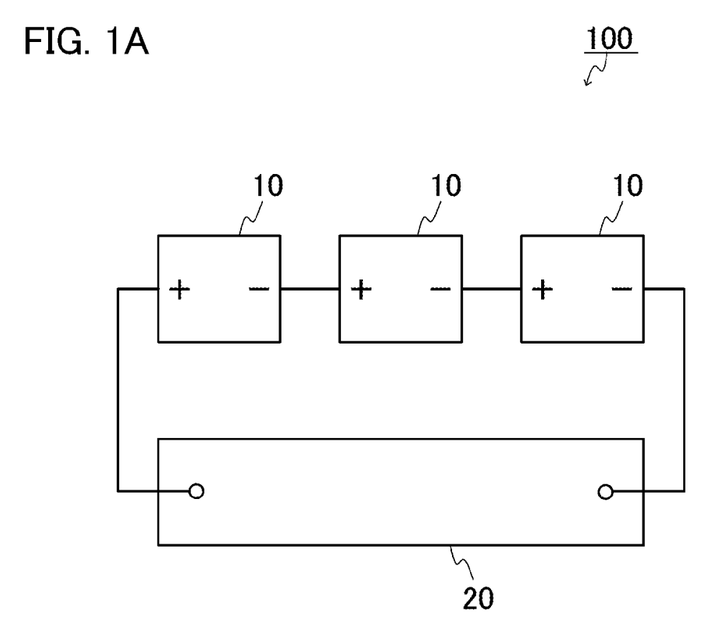
FIG. 1(A) is a configuration diagram of an organic EL lighting device to be repaired in the present embodiment.

FIG. 1(A) shows a configuration diagram of organic EL lighting device 100 to be repaired in the present embodiment. As shown in FIG. 1(A), organic EL lighting device 100 of the present embodiment includes three organic EL panels 10 electrically connected in series and drive means 20. Three organic EL panels 10 shown in FIG. 1(A) each have the same configuration to one another. In each of organic EL panels 10 shown in FIG. 1(A), an anode terminal is provided at the end indicated by "+" and a cathode terminal is provided at the end indicated by "−".

In FIG. 1(A), the number of organic EL panels is three. However, the present invention is not limited thereto and the number of organic EL panels may be one or more.

In the present embodiment, a plurality of organic EL panels 10 may be connected in parallel. However, a plurality of organic EL panels 10 is preferably connected in series as shown in FIG. 1(A). In the case where a plurality of organic EL panels 10 is connected in parallel, there is a problem that, when shorts (short circuits) are caused in one panel 10, current concentration is caused in that panel and the light of all the panels goes off. On the other hand, in the case where a plurality of organic EL panels 10 is electrically connected in series, even when shorts are caused in one panel 10, only the light of that panel goes off but the light of other panels stays on. Therefore, the serial connection is preferable.

(Organic EL Panel)

Figure 1B:
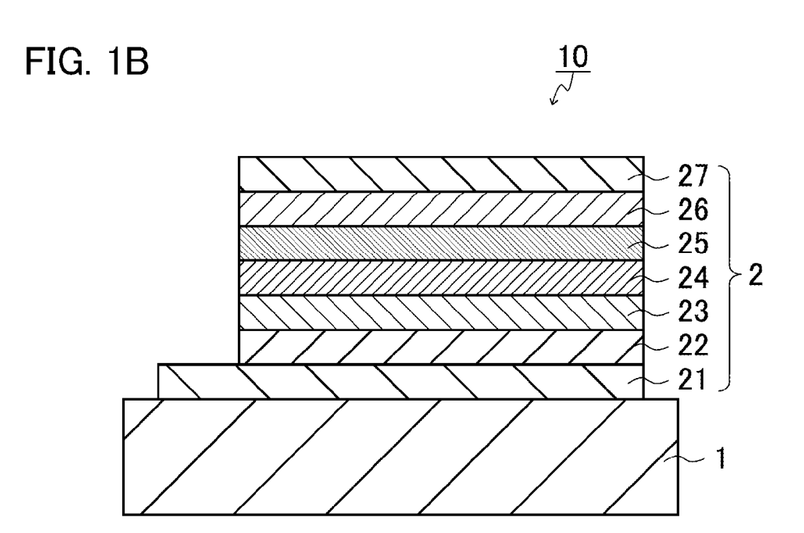
FIG. 1(B) is a cross sectional view of the organic EL panel of the organic EL lighting device.

FIG. 1(B) shows a cross sectional view of organic EL panel 10 to be repaired in the present embodiment. Organic EL panel 10 shown in FIG. 1(B) includes transparent substrate 1 and organic EL element 2. Organic EL element 2 is a surface lighting element provided on a surface of transparent substrate 1. As shown in FIG. 1(B), for example, organic EL element 2 is a laminate in which anode (transparent electrode) 21, hole injection layer 22, hole transport layer 23, light-emitting layer 24, electron transport layer 25, electron injection layer 26, and cathode (metal electrode) 27 are laminated in this order on a surface of transparent substrate 1. Examples of transparent substrate 1 include glasses, examples of anode 21 include transparent conductive films (for example, Indium Tin Oxide (ITO)), and examples of cathode 27 include metal thin films such as aluminum and the like. Light-emitting layer 24 includes an organic material and the like.

In organic EL panel 10 shown in FIG. 1(B), light-emitting layer 24 has a single unit configuration. However, organic EL panel 10 to be repaired in the present embodiment is not limited thereto. For example, with the aforementioned organic EL element being considered as a single unit, organic EL panel 10 may have a dual unit configuration or a triple unit configuration by laminating the organic EL elements.

(Drive Means)

Drive means 20 is not particularly limited as long as it includes means for applying a voltage to anode 21 and cathode 27. Drive means 20 may be according to a common method. In the present embodiment, frame frequency F in the case where organic EL panel 10 is driven by drive means 20 at the time of turning on the light is not particularly limited. Preferably, the frame frequency F is equal to or higher than 60 Hz, for example. This allows a flicker to be prevented.

(Repair Step)

A repair step of organic EL lighting device 100 of the present embodiment will be described hereinbelow. First, a pulse voltage is applied to organic EL panel 10 by drive means 20. The time for applying a voltage (ON-period) is equal to or longer than time constant T that is the product of element capacity C of the organic EL element and wiring resistance R including the element. Next, the voltage application is turned off for a fixed period of time. Then, a voltage is repeatedly applied, with the ON-period and the OFF-period being considered as one cycle.

In the present embodiment, in the case where a material at the long wavelength side is used as an organic light-emitting material in the organic layer, there is a possibility that a material is excited by the light at the short wavelength side, light leakage currents are caused, and repair conditions are changed. In this case, it is preferable to perform a repair step under low light conditions.

In the present embodiment, the pulse voltage is a forward voltage or a reverse voltage. The forward voltage refers to a voltage to be applied to organic EL panel 10 such that the potential of anode 21 becomes higher than the potential of cathode 27. The reverse voltage refers to a voltage to be applied to organic EL panel 10 such that the potential of anode 21 becomes lower than the potential of cathode 27. In this case, cathode 27 may be a ground potential or a frame ground.

In the present embodiment, the value of a pulse voltage is not particularly limited. For example, when light-emitting layer 24 has a one-layer (single unit) configuration as organic EL panel 10 of the present embodiment, the value may be set equal to or higher than a threshold voltage of an organic EL panel. Preferably, the value of a pulse voltage may be set in the range from a threshold voltage to a threshold voltage +3V. When light-emitting layer 24 has a two-layer (dual unit) configuration or a three-layer (triple unit) configuration, the value of a pulse voltage may exceed the threshold voltage or a voltage to be applied to the threshold voltage may be increased. For example, when light-emitting layer 24 has a three-layer (triple unit) configuration, the specific value of a pulse voltage may be the value obtained by adding 3V to 6V to the threshold voltage. As the value of a pulse voltage exceeds the threshold voltage, charging is completed (inrush currents are not caused), injection is started, and the light emission is started.

Figure 2:
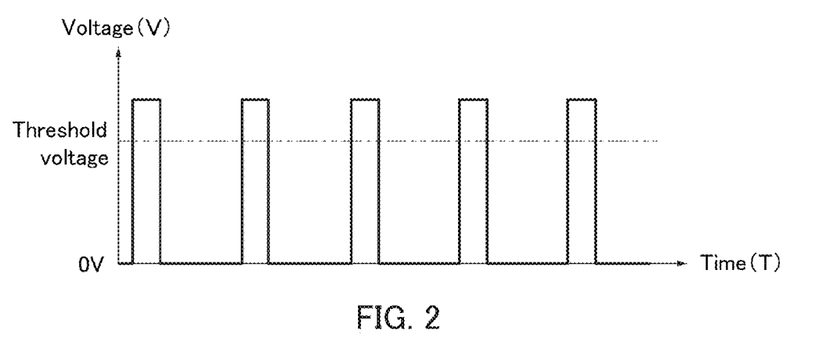
FIG. 2 shows an example of the pulse waveform of a voltage applied to an organic EL panel in Embodiment 1.
Figure 3:
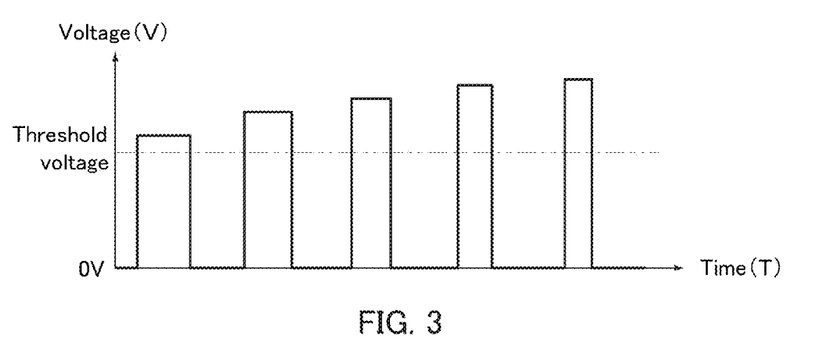
FIG. 3 shows another example of the pulse waveform of a voltage applied to an organic EL panel in Embodiment 1.
Figure 4:
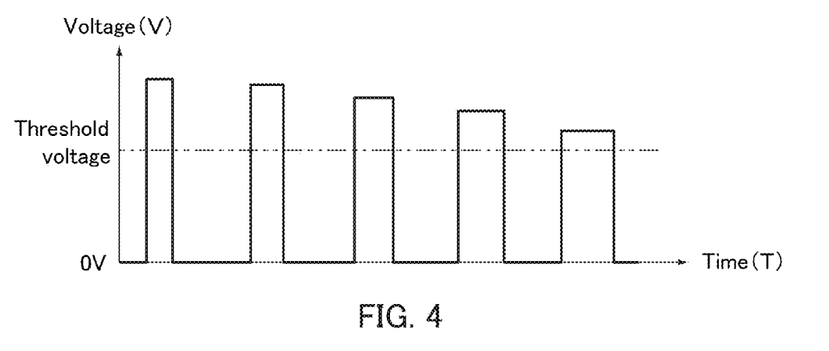
FIG. 4 shows still another example of the pulse waveform of a voltage applied to an organic EL panel in Embodiment 1.

In the present embodiment, the value of a voltage to be repeatedly applied is not particularly limited. For example, as shown in the pulse waveform of FIG. 2, the value of a voltage to be repeatedly applied may be constant. Also, the value of a voltage to be repeatedly applied may be increased in stages as shown in the pulse waveform of FIG. 3. This allows an element to be repaired efficiently in the case where the element is repaired in order of seriousness of inner defect or the likelihood of causing a short, for example. At this time, the repair effect is improved by applying a voltage for a long time as a pulse wave in the case where the value of a voltage to be repeatedly applied is low and applying a voltage for a short time as a pulse wave in the case where the value of a voltage to be repeatedly applied is high. Specifically, the repair effect is improved by keeping the value obtained by multiplying a voltage by a time constant. Also, the value of a voltage to be repeatedly applied may be decreased in stages as shown in the pulse waveform of FIG. 4. This makes it possible to reduce a possibility that an organic EL element is damaged due to the continuous repetitive application of a high voltage and a high current in the case where an element is made thinner with emphasis on luminous efficiency, for example. At this time, the repair effect is improved by applying a voltage for a short time as a pulse wave in the case where the value of a voltage to be repeatedly applied is high and applying a voltage for a long time as a pulse wave in the case where the value of a voltage to be repeatedly applied is low. In other words, in each of the respective cases, there is an optimal voltage and an optimal application method for repair.

With respect to a square wave of the pulse waveform, for preventing a voltage rise from being dull due to a capacitor component of an organic EL element, a boot voltage (bootstrap, charge pump) equal to or higher than a set voltage may be applied to the set voltage at the start of the voltage application. This allows elements to be repaired more reliably.

Figure 5:
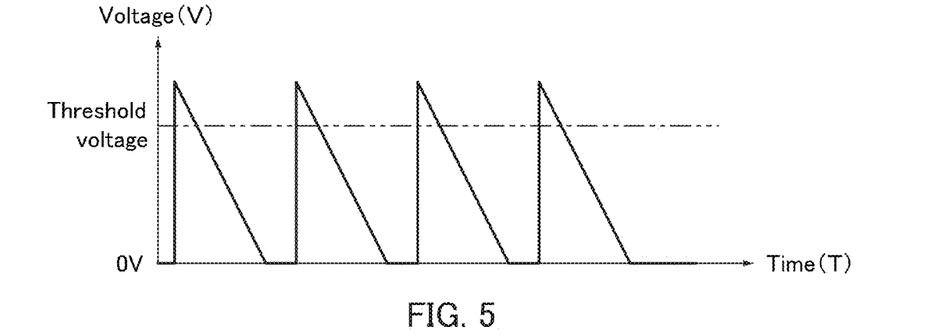
FIG. 5 shows yet another example of the pulse waveform of a voltage applied to an organic EL panel in Embodiment 1.

The pulse waveform is not particularly limited. For example, the pulse waveform is at least one selected from the group consisting of square waves (rectangular waves), reverse sawtooth waves, sawtooth waves (ramp waves), triangle waves, Sine waves (sinusoidal waves), trapezoidal waves, Gaussian pulse waves, and stepped sinusoidal waves. The pulse waveform selected from the group may be a discrete pulse wave; PWM (Pulse width modulation) or PAM (Pulse-amplitude modulation); or the like. This allows a voltage to be applied momentary. Furthermore, the pulse waveform is preferably at least one selected from the group consisting of the square waves shown in FIGS. 3 and 4, reverse sawtooth waves, sawtooth waves, triangle waves, and Sine waves. In the case where the pulse waveform is a reverse sawtooth wave as shown in the pulse waveform of FIG. 5, inrush currents are apt to be caused at the time of applying a repair voltage to an organic EL element (organic EL panel), and this allows an easy repair. In addition, in the case where the pulse waveform is a reverse sawtooth wave, since a voltage is lowered over time, a voltage is not continuously applied to the portions just after repair, and this prevents the expansion of repair marks. Generally, when an organic EL element is configured with emphasis on luminous efficiency, the element may be thinned for improving the injection efficiency of a carrier by an electric field and for reducing a drive voltage. When a rapid high voltage is applied to a thinned organic EL element, there is a high possibility that normal portions of the element may be damaged. In the case where the pulse waveform is a sawtooth wave, damage to elements can be reduced even with thinned organic EL elements, and a phenomenon of breakdown of originally normal portions can be avoided. In the case where the pulse waveform is a triangle wave or a Sine wave, a balanced prevention of the aforementioned phenomenon can be achieved and elements can be repaired efficiently. The pulse waveform may be selected suitably according to the material used for an organic EL element, the configuration of the element, and the like.

The time for repeatedly applying a voltage is not limited, and the time is, for example, in the range from 1 second to 5 minutes or in the range from 10 seconds to 2 minutes. The time for repeatedly applying a voltage is preferably in the range from 30 seconds to 1 minute because it can deal with any material and the change of device configuration of an organic EL element and the time for the repair step does not affect production throughput.

In the present embodiment, the time for applying a voltage (ON-period) is, as described above, equal to or longer than a time constant that is the product of an element capacity of an organic EL element and a wiring resistance including the element. This makes it possible to pass a current sufficient for opening or insulating defect portions by Joule heat.

According to a repair method of the present embodiment, it is possible to electrically repair an element during an inspection step after manufacturing a panel without conducting a very long repair step using laser light. Since the production cycle time of the repair step is thereby reduced, and, for example, the production quantity per day is thereby improved, the production cycle time in whole can be reduced.

The repair step using laser light generally performs aging and burns defect portions where shorts and the like are caused over time, which is a kind of symptomatic method. However, the aging cannot be performed forever and the sources (causes) of defects such as shorts and the like that have not yet caused would remain after the aging step. As a result, there is a possibility that a surface lighting device that has been repaired by the repair step using laser light may cause malfunction after shipping. In contrast, in the present invention, since the sources of defects such as shorts and the like that have been difficult to detect can be repaired electrically within a short time without omission, the malfunction of the surface lighting device in a market after shipping can be reduced significantly.

In the present embodiment, as described above, when light-emitting layer 24 has a one-layer (single unit) configuration, the value of a pulse voltage is preferably as follows although it varies depending on a material to be used or an element configuration: the lower limit is in the range from a breakdown voltage to 0V; and the upper limit is in the range from a threshold voltage to a threshold voltage +3V. Thus the occurrence of bumps due to leakage currents or minute leakage currents can be repaired equal to or less than a threshold voltage and within the range of about ±1V from 2 to 3V.

Figure 14:
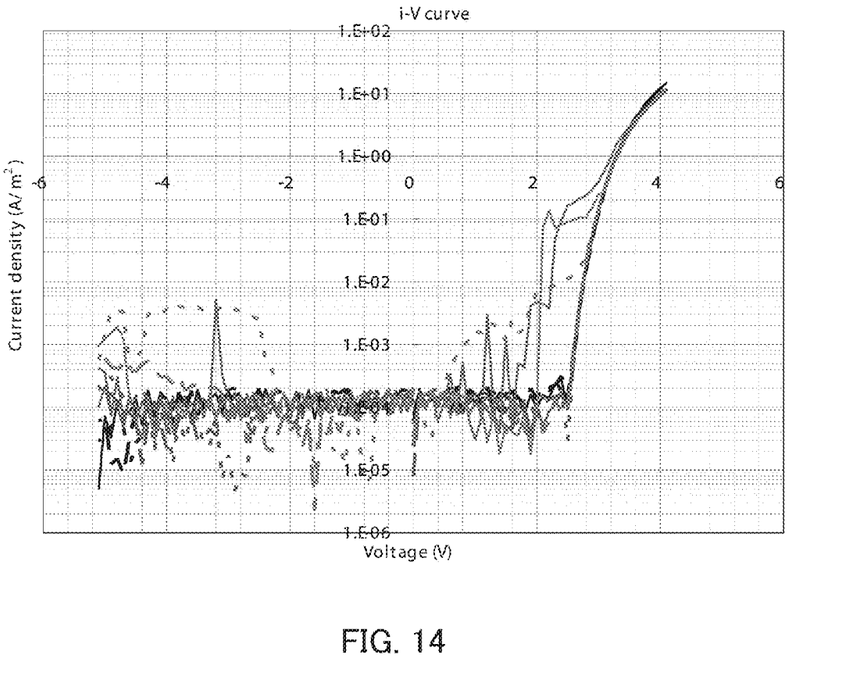
FIG. 14 is a graph showing I-V characteristic of an organic EL lighting device before repair.

The inventors of the present invention have analyzed in detail white organic EL panels in each of which a light-emitting layer has a single unit configuration. As a result, the inventors have found the problem that bumps due to leakage currents or minute leakage currents intensively occur equal to or less than a threshold voltage and within the range of about ±1V from 2 to 3V as shown in FIG. 14.

Furthermore, the inventors of the present invention have found that the aforementioned problem is caused by the following factors. That is, first, one of the factors is a surface gap such as grains and spikes caused in a transparent conductive film formed of an Indium Tin Oxide (ITO) or the like used for a base layer of an organic layer as an anode. Since this may cause damage to an organic film on ITO or reduce the thickness of an organic layer, the distance between the anode and cathode may decrease. Then, leakage currents or shorts are caused at the portions locally exposed to a high electric field. As another factor, since a metal layer such as aluminum or the like used for a cathode traces the surface of an organic layer that is a base layer of the metal layer at the time of forming the metal layer on the organic layer, a cathode layer enters into the thickness irregularities, pinholes, and the like of the organic layer (whisker is caused), and thus leakage currents or shorts are caused as in the case of the anode. Furthermore, the inventors of the present invention have found that the surface gap is caused by aggregations, non-uniformity of film quality, and thickness irregularities due to splash such as bumping or the like of materials at the time of forming an organic layer by a vacuum evaporation method.

As still another factor, the inventors of the present invention have found that the above-described problem is caused by undesirable mixing of dusts or foreign matters at the time of forming ITO or undesirable mixing of Ce residuals used for polishing the surface of a transparent substrate such as a soda glass prepared by a float method at the time of forming $SiO_2$ that is a base layer of ITO and also a barrier film (buffer layer).

Then, the inventors of the present invention conducted earnest studies in consideration of the causes of the problems. As a result, the inventors have found that, in the case where the above-described problem is caused by the undesirable mixing of dusts or foreign matters, the splash, the undesirable mixing of the Ce residuals, and the like among the above-described factors of defects such as shorts and the like, elements can be repaired efficiently with the pulse voltage in the range from a threshold voltage to a threshold voltage +3V.

In the present embodiment, an organic EL panel is used as a light-emitting panel to be repaired. The organic EL panel is a light-emitting diode and is also a capacitor structurally provided with a big parallel plate. Thus when an initial current is applied (voltage is applied), since there is a need to charge the capacitor first, an inrush current is caused. In the present embodiment, by utilizing the inrush current, defect portions having possibilities of causing shorts in future are electrically repaired efficiently by Joule heat or localized discharge energy. Thus there is no need to apply a pulse voltage for a long time.

The present embodiment was described with reference to an organic EL lighting device as a light-emitting device. However, the present invention is not limited thereto. For example, the light-emitting device may be a backlight for a liquid crystal display or the like; an indicator light such as signage or the like; a decorative lamp such as an illumination lamp or the like; or the like.

Embodiment 2

An organic EL lighting device to be repaired in the present embodiment is not particularly limited and may be the same as that of Embodiment 1, for example. A repair method of the present embodiment will be described hereinbelow with reference to the case where the method is applied to organic EL lighting device 100 shown in FIG. 1 in the same manner as in Embodiment 1.

Figure 6:
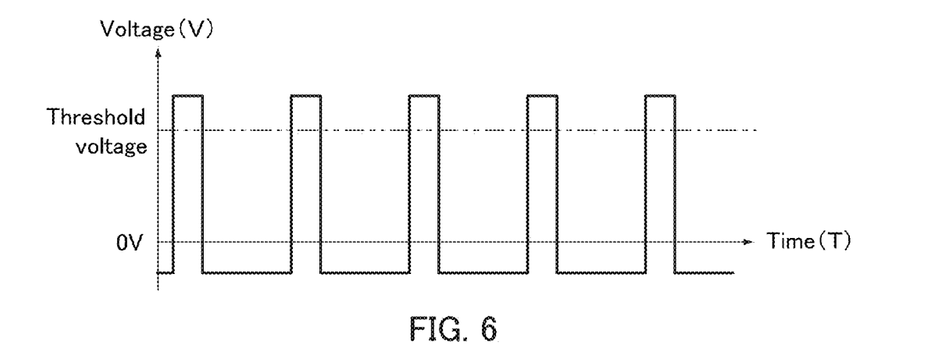
FIG. 6 shows an example of the pulse waveform of a voltage applied to an organic EL panel in Embodiment 2.
Figure 7:
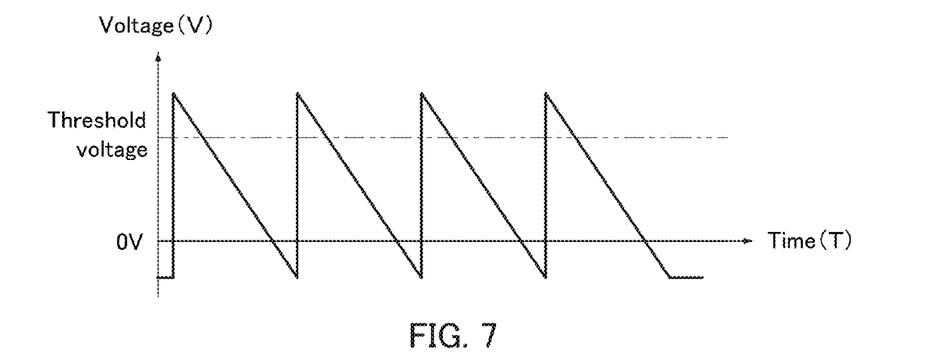
FIG. 7 shows another example of the pulse waveform of a voltage applied to an organic EL panel in Embodiment 2.

As shown in the pulse waveforms of FIGS. 6 and 7, a repair method of the present embodiment is performed in the same manner as that of Embodiment 1 except that a voltage to be applied is a forward voltage and a reverse direction bias is applied during the OFF-period. FIG. 6 shows the case where the pulse waveform is a square wave and FIG. 7 shows the case where the pulse waveform is a reverse sawtooth wave.

Note here that "a reverse direction bias is applied" means that a reverse bias is applied to an anode with respect to a cathode. In this case, the cathode may be a ground potential or a frame ground.

The value of a reverse direction bias is not particularly limited, and may be a value lower than an absolute value of a breakdown voltage (a value below the breakdown voltage), for example. When a light-emitting layer has a single unit configuration as in the case of the present embodiment, the voltage value is an absolute value equal to or less than 5V, and when a light-emitting layer has a dual unit configuration or a triple unit configuration, the voltage value is a value obtained by increasing the aforementioned voltage value or multiplying the aforementioned voltage value by the number of layers.

Generally, in the application of a forward pulse voltage, when the time for one cycle is short, a stored charge from the previous cycle remains, and this makes it difficult to apply a voltage in the next period (cycle). By the use of the repair method of the present embodiment, since a stored charge can be suppressed by applying a reverse direction bias during the OFF-period of the period (cycle) of applying a forward voltage, a voltage can be applied more reliably in the next period (cycle).

In the present embodiment, as described above, a reverse bias is applied during the OFF-period of every period (1 cycle). However, the present invention is not limited thereto, and a reverse bias may be applied every multiple cycles such as every two cycles, every three cycles, and the like, for example.

Embodiment 3

An organic EL lighting device to be repaired in the present embodiment is not particularly limited and may be the same as that of Embodiment 1, for example. A repair method of the present embodiment will be described hereinbelow with reference to the case where the method is applied to organic EL lighting device 100 shown in FIG. 1 in the same manner as in Embodiment 1.

Figure 8:
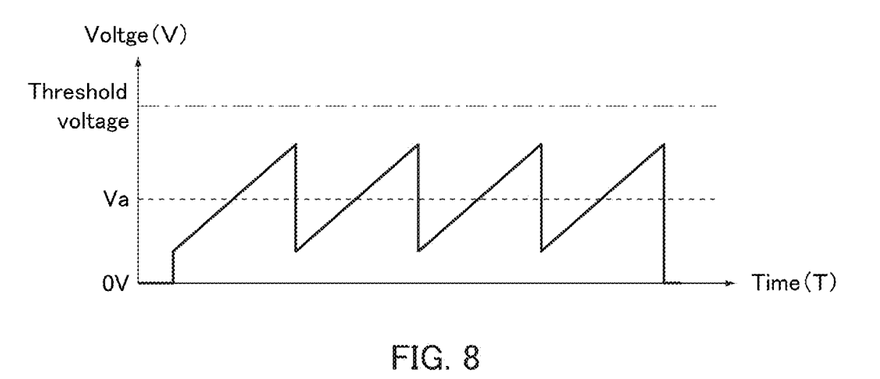
FIG. 8 shows an example of the pulse waveform of a voltage applied to an organic EL panel in Embodiment 3.

A repair step of organic EL panel 10 of the present embodiment will be described hereinbelow. First, a pulse voltage is applied to organic EL panel 10 by drive means 20. The value of a voltage to be applied is within the range of ±1.5V at most from ½ potential (Va) of a threshold voltage as shown in the pulse waveform of FIG. 8. The application voltage thereof is generally equal to or less than a threshold voltage. Then, as shown in the pulse waveform of FIG. 8, a voltage is repeatedly applied while linearly sweeping the value of a voltage from the low-voltage side to the high-voltage side.

In the present embodiment, the voltage of a pulse wave is either a forward voltage or a reverse voltage.

In the present embodiment, the pulse waveform to be applied is not particularly limited and may be the same as those described in Embodiment 1.

In the present embodiment, the time for one cycle of sweeping is not particularly limited, and is in the range from 5 seconds to 30 seconds or in the ranger from 10 seconds to 20 seconds, for example. Also, the time for the whole cycle is not particularly limited, and is in the range from 3 minutes to 10 minutes or in the range from 3 minutes to 5 minutes, for example.

According to the repair method of the present embodiment, since an element can be electrically repaired during an inspection step after manufacturing a panel without using laser light, it is possible to reduce the production cycle time.

Furthermore, according to the repair method of the present embodiment, the occurrence of bumps due to leakage currents or minute leakage currents can be repaired more reliably equal to or less than a threshold voltage and within the range of about ±1V from 2 to 3V.

The inventors of the present invention have found that the occurrence of bumps equal to or less than a threshold voltage is caused also by the materials or the configurations of organic EL elements to a large degree in addition to the foreign matters and the dusts. That is, since energy of forbidden bands (bandgaps) of the respective materials of transparent electrode layers used for anodes, organic layers, and metal layers used for cathodes presents in the range from 0V to nearly a threshold voltage of organic EL elements, leakage currents are apt to be caused at the time of applying a voltage depending on the configurations, conditions, states, and the like of the elements. Specifically, the order from the low-voltage side is as follows: metals (cathodes), organic layers, and transparent electrodes.

As a result of the earnest studies on the materials and configurations of the organic EL elements, the inventors of the present invention have found that elements can be repaired efficiently by a method with a voltage equal to or less than a threshold voltage. Also, the inventors have found that repair shapes (repair marks) can be minimized and also insulation portions after repair can be minimized by not applying an excessive repair voltage.

Figure 15:
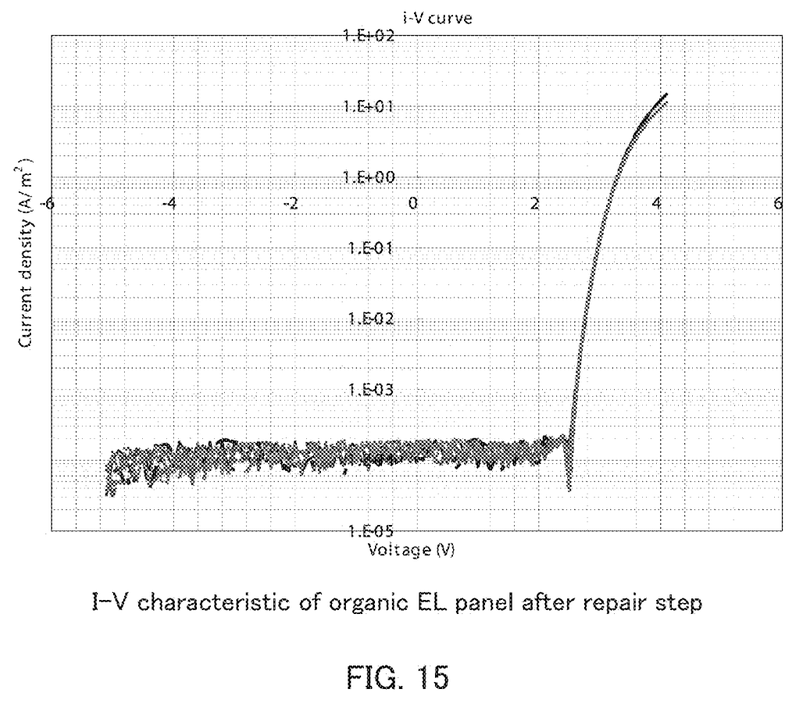
FIG. 15 is a graph showing I-V characteristic of an organic EL lighting device after repair.

Furthermore, as a result of the earnest studies, the inventors of the present invention have found that the method of repeatedly applying a voltage in the aforementioned range (range of about ±1.5V at most from ½ potential of a threshold voltage) while sweeping from the low-voltage side to the high-voltage side is effective. The application voltage is generally equal to or less than a threshold voltage, and elements can be repaired mildly (with minimum repair portions) with a voltage with which an organic EL element is not fully charged. FIG. 15 shows I-V characteristic of an organic EL lighting panel that has been repaired by a repair method of the present embodiment. As can be seen from FIG. 15, the following result is obtained: the occurrence of bumps due to leakage currents or minute leakage currents can be repaired more reliably equal to or less than a threshold voltage and within the range of about ±1V from 2 to 3V.

Figure 9:
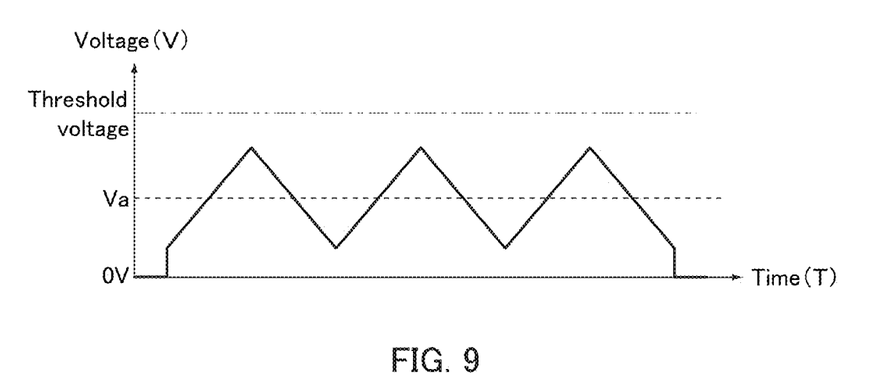
FIG. 9 shows another example of the pulse waveform of a voltage applied to an organic EL panel in Embodiment 3.

In the present embodiment, as shown in the pulse waveform of FIG. 9, a voltage may be repeatedly applied while sweeping from the high-voltage side to the low-voltage side after sweeping from the low-voltage side to the high-voltage side, for example. Since the leakage currents or shorts caused by the materials or the configurations of organic EL elements are self-repaired utilizing the energy of the forbidden bands of the materials, for example, there is no need to rapidly change or apply a voltage. By applying a voltage having the pulse wave shown in FIG. 9, since elements can be repaired during the sweep from the low-voltage side to the high-voltage side and also during the sweep from the high-voltage side to the low-voltage side and defect portions can be repaired with minimum energy, repair shapes (repair marks) can be minimized and also insulation portions (breakdown portions of element configuration) after repair can be minimized. This brings about a good appearance and also prevents continuous defects such as re-shorts in future due to non-uniformity of insulation portions.

Figure 10:
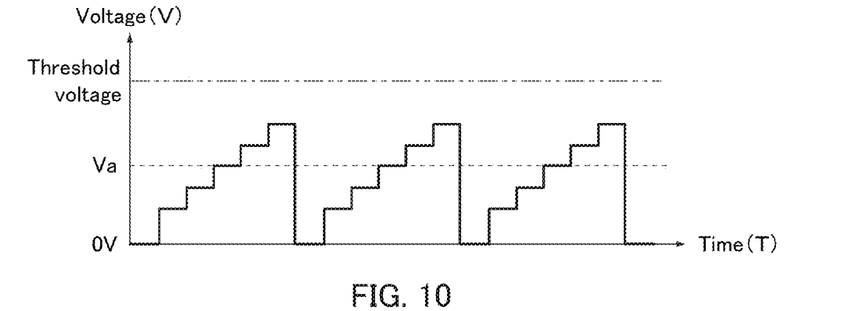
FIG. 10 shows still another example of the pulse waveform of a voltage applied to an organic EL panel in Embodiment 3.
Figure 11:
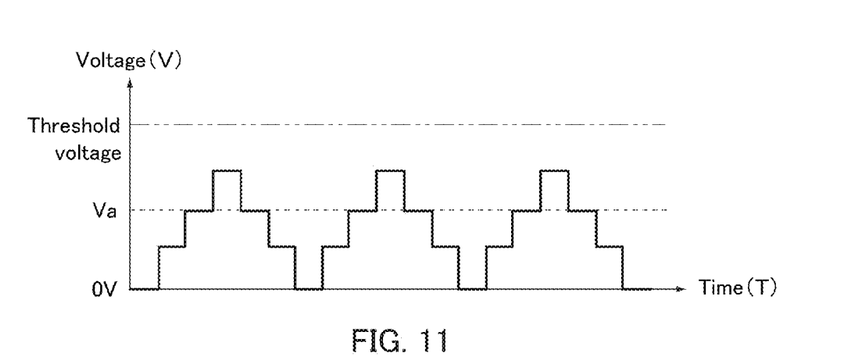
FIG. 11 shows yet another example of the pulse waveform of a voltage applied to an organic EL panel in Embodiment 3.
Figure 12:
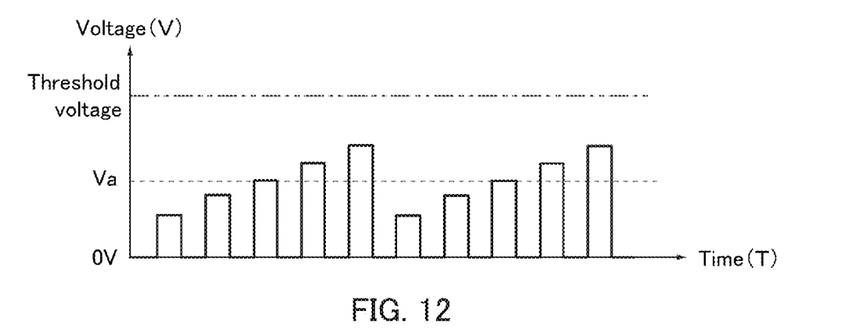
FIG. 12 shows further another example of the pulse waveform of a voltage applied to an organic EL panel in Embodiment 3.
Figure 13:
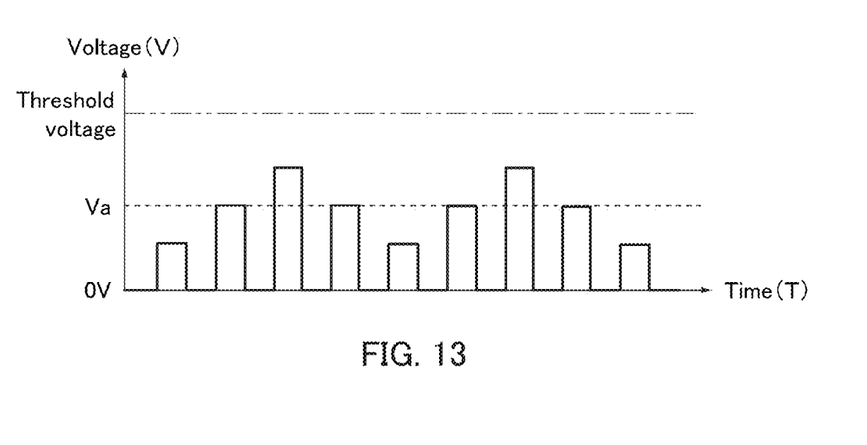
FIG. 13 shows still further another example of the pulse waveform of a voltage applied to an organic EL panel in Embodiment 3.

In the present embodiment, for example, as shown in the pulse waveforms of FIGS. 10 and 11, each repetition cycle may include OFF-period. That is, as shown in the pulse waveform of FIG. 10, each repetition cycle may include OFF-period after the sweep from the low-voltage side to the high-voltage side. Also, as shown in the pulse waveform of FIG. 11, each repetition cycle may include OFF-period after the sweep from the low-voltage side to the high-voltage side followed by the sweep from the high-voltage side to the low-voltage side. This makes it possible to continuously suppress the stored charge due to the application of a forward voltage and allows the voltage application in the next cycle to be more reliable, for example. Also, since elements can be repaired during the sweep from the high-voltage side to the low-voltage side and defect portions can be repaired with minimum energy, repair marks can be minimized and also insulation portions (breakdown portions of element configuration) after repair can be minimized. This brings about a good appearance and also prevents continuous defects such as re-shorts in future. Also, in the present embodiment, for example, as shown in the pulse waveforms of FIGS. 12 and 13, each step of increasing or reducing a voltage may include OFF-period.

The repair step of the present embodiment may be performed alone, or may be performed before or after the repair step of Embodiment 1 or 2. Preferably, the repair step of the present embodiment is performed before the repair step of Embodiment 1 or 2. This makes it possible to manufacture an organic EL lighting device of high reliability that won't cause short circuits over a long period of time.

Embodiment 4

In the present embodiment, a manufacturing method for an organic EL panel will be described hereinbelow.

In the present embodiment, a manufacturing method for a surface lighting device includes at least: a formation step of forming a surface lighting device by laminating a first electrode layer, an organic light-emitting layer, and a second electrode layer in this order on a base material; and a repair step of repairing the surface lighting device. The manufacturing method of the present embodiment is characterized in that the repair step is performed according to at least one of the repair methods of Embodiments 1 to 3. The formation step is not particularly limited, and can be performed according to a common method.

Embodiment 5

In the present embodiment, an organic EL lighting device will be described hereinbelow.

In the present embodiment, an organic EL lighting device includes an organic EL panel manufactured by the method according to Embodiment 4 and drive means that applies a voltage to a first electrode layer and a second electrode layer of the organic EL panel. The drive means is not particularly limited, and may be the drive means described in Embodiment 1, for example.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

EXPLANATION OF REFERENCE NUMERALS 21 anode
24 light-emitting layer
27 cathode
10 organic EL panel
100 organic EL lighting device

The invention claimed is:

1. A method for repairing an organic electroluminescence (EL) element, comprising:
   an application step of repeatedly applying a pulse voltage having an ON-period and an OFF-period to an organic EL element to repair the organic EL element,
   wherein in the application step, the pulse voltage is a forward voltage during the ON-period, and a reverse direction bias lower than an absolute value of a breakdown voltage is applied during the OFF-period,
   the ON-period is equal to or longer than a time constant that is the product of an element capacity of the organic EL element and a wiring resistance including the element, and
   wherein repairing the organic EL element comprises repairing a short circuit between an anode and a cathode of the EL element.

2. The method according to claim 1, wherein the waveform of the pulse wave is at least one selected from the group consisting of square waves (rectangular waves), reverse sawtooth waves, sawtooth waves (ramp waves), triangle waves, Sine waves (sinusoidal waves), trapezoidal waves, Gaussian pulse waves, and stepped sinusoidal waves.

3. The method according to claim 2, wherein in the application step, at least one of increase or reduction of the forward voltage to be applied is performed every repetition of voltage application.

4. The method according to claim 2, wherein in the application step, the forward voltage is repeatedly applied while sweeping from the high-voltage side to the low-voltage side after sweeping from the low-voltage side to the high-voltage side.

5. The method according to claim 1, wherein in the application step, at least one of increase or reduction of the forward voltage to be applied is performed every repetition of voltage application.

6. A method for manufacturing an organic electroluminescence (EL) panel, comprising:
   a formation step of forming an organic EL panel by laminating a first electrode layer, an organic light-emitting layer, and a second electrode layer in this order on a base material; and
   a repair step of repairing the organic EL element laminated, wherein the repair step is performed by the method according to claim 1.

7. The method according to claim 1, wherein in the application step, the forward voltage is repeatedly applied while sweeping from the high-voltage side to the low-voltage side after sweeping from the low-voltage side to the high-voltage side.

8. A method for repairing an organic electroluminescence (EL) element, comprising:
   an application step of repeatedly applying a forward pulse voltage and not applying a reverse direction bias to an organic EL element to repair the organic EL element,
   wherein the pulse voltage is within a range of ±1.5V at most from ½ potential of a threshold voltage, while sweeping from a low-voltage side to a high-voltage side, and
   wherein repairing the organic EL element comprises repairing a short circuit between an anode and a cathode of the EL element.

9. The method according to claim 8, wherein in the application step, the forward voltage is repeatedly applied while sweeping from the high-voltage side to the low-voltage side after sweeping from the low-voltage side to the high-voltage side.

10. The method according to claim 9, wherein in the application step, each repetition cycle includes an OFF-period.

11. A method for manufacturing an organic electroluminescence (EL) panel, comprising:
    a formation step of forming an organic EL panel by laminating a first electrode layer, an organic light-emitting layer, and a second electrode layer in this order on a base material; and
    a repair step of repairing the organic EL element laminated, wherein the repair step is performed by the method according to claim 9.

12. The method according to claim 8, wherein in the application step, each repetition cycle includes an OFF-period.

13. A method for manufacturing an organic electroluminescence (EL) panel, comprising:
    a formation step of forming an organic EL panel by laminating a first electrode layer, an organic light-emitting layer, and a second electrode layer in this order on a base material, and
    a repair step of repairing the organic EL element laminated, wherein the repair step is performed by the method according to claim 8.

14. A method for repairing an organic electroluminescence (EL) element, comprising:
    an application step of repeatedly applying a pulse voltage having an ON-period and an OFF-period to an organic EL element to repair the organic EL element,
    wherein in the application step, the pulse voltage is a forward voltage, and a reverse direction bias is not applied,
    the ON-period is equal to or longer than a time constant that is the product of an element capacity of the organic EL element and a wiring resistance including the element, and
    wherein repairing the organic EL element comprises repairing a short circuit between an anode and a cathode of the EL element.

15. The method according to claim 14, wherein the waveform of the pulse wave is at least one selected from the group consisting of square waves (rectangular waves), reverse sawtooth waves, sawtooth waves (ramp waves), triangle waves, Sine waves (sinusoidal waves), trapezoidal waves, Gaussian pulse waves, and stepped sinusoidal waves.

16. The method according to claim 14, wherein in the application step, the forward voltage is repeatedly applied within a range of ±1.5V at most from ½ potential of a threshold voltage, while sweeping from a low-voltage side to a high-voltage side.

17. The method according to claim 15, wherein in the application step, the forward voltage is repeatedly applied within a range of ±1.5V at most from ½ potential of a threshold voltage, while sweeping from a low-voltage side to a high-voltage side.

* * * * *